United States Patent
Huai et al.

(10) Patent No.: US 6,381,105 B1
(45) Date of Patent: Apr. 30, 2002

(54) HYBRID DUAL SPIN VALVE SENSOR AND METHOD FOR MAKING SAME

(75) Inventors: Yiming Huai; Geoff Anderson, both of Pleasanton; Mahendra Pakala, San Jose; Wenjie Chen, Cupertino; Ningjia Zhu, Fremont, all of CA (US)

(73) Assignee: Read-Rite Corporation, Fremont, CA (US)

( * ) Notice: Subject to any disclaimer, the term of this patent is extended or adjusted under 35 U.S.C. 154(b) by 0 days.

(21) Appl. No.: 09/426,171

(22) Filed: Oct. 22, 1999

(51) Int. Cl.$^7$ .................................................. G11B 5/39
(52) U.S. Cl. ................................... 360/314; 360/324.11
(58) Field of Search ........................ 360/324.1–324.12, 360/315, 314; 324/252; 428/692, 693

(56) References Cited

U.S. PATENT DOCUMENTS

| | | | |
|---|---|---|---|
| 5,206,590 A | 4/1993 | Dieny et al. ................. 324/252 |
| 5,287,238 A | 2/1994 | Baumgart et al. ........... 360/314 |
| 5,546,253 A | 8/1996 | Che ........................ 360/324.1 |
| 5,583,725 A | 12/1996 | Coffey et al. ........... 360/324.11 |
| 5,585,986 A | 12/1996 | Parkin ......................... 360/324 |
| 5,608,593 A | 3/1997 | Kim et al. ............. 360/324.12 |
| 5,612,098 A | 3/1997 | Tan et al. .................... 427/529 |
| 5,633,770 A | 5/1997 | Che ........................ 360/324.1 |
| 5,637,235 A | 6/1997 | Kim et al. ..................... 216/22 |
| 5,650,887 A | 7/1997 | Dovek et al. ................. 360/75 |
| 5,668,688 A | 9/1997 | Dykes et al. ............. 360/324.1 |
| 5,701,222 A | 12/1997 | Gill et al. .................... 360/314 |
| 5,705,973 A | 1/1998 | Yuan et al. ................ 338/32 R |
| 5,748,399 A | 5/1998 | Gill ............................. 360/66 |
| 5,751,521 A | 5/1998 | Gill ............................ 360/314 |
| 5,768,069 A | 6/1998 | Mauri ......................... 360/314 |
| 5,784,772 A | 7/1998 | Ewasko et al. .......... 29/603.15 |
| 5,793,207 A | 8/1998 | Gill ............................ 324/252 |
| 5,825,595 A | 10/1998 | Gill ............................ 360/314 |
| 5,856,897 A | 1/1999 | Mauri ......................... 360/314 |
| 5,859,753 A | 1/1999 | Ohtsuka et al. ............. 360/314 |
| 5,869,963 A | 2/1999 | Saito et al. .................. 324/252 |
| 6,031,692 A * | 2/2000 | Kawawake et al. ..... 360/324.12 |
| 6,055,136 A * | 4/2000 | Gill et al. .................... 360/314 |
| 6,074,767 A * | 6/2000 | Lin ........................ 360/324.11 |
| 6,115,224 A * | 9/2000 | Saito ........................ 360/324.1 |
| 6,129,957 A * | 10/2000 | Xiao et al. ................... 427/548 |
| 6,141,191 A * | 10/2000 | Lee et al. ................. 360/324.1 |
| 6,157,524 A * | 12/2000 | Nakazawa et al. ...... 360/324.12 |
| 6,175,476 B1 * | 1/2001 | Huai et al. ............. 360/324.11 |
| 6,191,926 B1 * | 2/2001 | Everitt et al. ........... 360/324.11 |
| 6,210,818 B1 * | 4/2001 | Saito ........................... 428/692 |
| 6,221,172 B1 * | 4/2001 | Saito et al. .................. 148/108 |
| 6,222,707 B1 * | 4/2001 | Huai et al. ................ 360/324.1 |
| 6,271,997 B1 * | 8/2001 | Gill ............................. 360/314 |

* cited by examiner

Primary Examiner—Jefferson Evans

(57) ABSTRACT

A hybrid dual spin valve sensor includes a standard spin valve sharing a common free layer with a synthetic spin valve. The standard spin valve consists of a first antiferromagnetic layer having a first blocking temperature, a first soft ferromagnetic layer, a first spacer layer, and the common free layer. The synthetic spin valve consists of the common free layer, a second spacer, a second soft ferromagnetic layer, a third spacer layer, a third soft ferromagnetic layer, and a second antiferromagnetic layer having a second blocking temperature. Each of the two antiferromagnetic layers has a fixed magnetization orientation antiparallel to the other. A lead set configured to pass a sensing current from a current source through the hybrid dual spin valve, and a sensing circuit configured to measure changes in resistance within the hybrid dual spin valve, complete the sensor. A method for producing a hybrid dual spin valve sensor includes providing such a sensor wherein the magnetization orientations of the two antiferromagnetic layers are disordered, followed by processing at a first temperature and a second temperature. Processing at the first temperature is used to set the magnetization orientation of the antiferromagnetic layer with the higher blocking temperature. Processing at a lower second temperature is used to set the magnetization orientation of the antiferromagnetic layer with the lower blocking temperature such that it is antiparallel to the magnetization orientation of the antiferromagnetic layer with the higher blocking temperature.

27 Claims, 9 Drawing Sheets

HYBRID DUAL SPIN VALVE SENSOR AND METHOD FOR MAKING SAME

BACKGROUND OF THE INVENTION

This invention relates generally to magnetic disk drives, more particularly to spin valve magnetoresistive (MR) read heads, and most particularly to structures and methods for a read sensor incorporating a hybrid dual spin valve.

Magnetic disk drives are used to store and retrieve data for digital electronic apparatuses such as computers. In FIGS. 1A and 1B, a magnetic disk drive D of the prior art includes a sealed enclosure 1, a disk drive motor 2, a magnetic disk 3 supported for rotation by a spindle S1 of motor 2, an actuator 4, and an arm 5 attached to a spindle S2 of actuator 4. A suspension 6 is coupled at one end to the arm 5, and at its other end to a read/write head, or transducer 7. The transducer 7 is typically an inductive write element with a sensor read element. As the motor 2 rotates the disk 3, as indicated by the arrow R, an air bearing is formed under the transducer 7 to lift it slightly off of the surface of the disk 3. Various magnetic "tracks" of information can be read from the magnetic disk 3 as the actuator 4 is caused to pivot in a short arc, as indicated by the arrows P. The design and manufacture of magnetic disk drives is well known to those skilled in the art.

The most common type of sensor used in the transducer 7 is the magnetoresistive (MR) sensor. A MR sensor is used to detect magnetic field signals by means of a changing resistance in a read element. A conventional MR sensor utilizes the anisotropic magnetoresistive (AMR) effect for such detection, where the read element resistance varies in proportion to the square of the cosine of the angle between the magnetization in the read element and the direction of a sense current flowing through the read element. When there is relative motion between the AMR sensor and a magnetic medium (such as a disk surface), a varying magnetic field from the medium causes changes in the direction of magnetization in the read element, thereby causing corresponding changes in resistance of the read element. The changes in resistance can be detected and correlated to the recorded data on the magnetic medium.

Another form of magnetoresistive effect is known as the giant magnetoresistive (GMR) effect. A GMR sensor resistance also varies in response to a changing external magnetic field, although by a different mechanism than with an AMR sensor. Sensors using the GMR effect are particularly attractive due to their greater sensitivity and higher total range in resistance than that provided by AMR sensors. One type of GMR sensor is known as a spin valve sensor. In a standard spin valve sensor there are two ferromagnetic (FM) layers separated by a layer of a non-magnetic metal such as copper. One of the ferromagnetic layers is a "free," or sensing, layer, with the orientation of its magnetization generally free to rotate in response to external fields. In contrast, the other ferromagnetic layer is a "pinned" layer whose magnetization is substantially fixed, or pinned, in a particular direction. In the prior art, this pinning has typically been achieved with an exchange-coupled antiferromagnetic (AFM) layer located adjacent to the pinned layer.

More particularly, and with reference to FIG. 2, a shielded, single-element magnetoresistive head 10 includes a first shield 12, a second shield 14, and a standard spin valve 16 disposed within a gap (G) between shields 12 and 14. An air bearing surface ABS is defined by the magnetoresistive head 10. The spin valve sensor can be centered in the gap G to avoid self-biasing effects. The design and manufacture of magnetoresistive heads, such as magnetoresistive head 10, are well known to those skilled in the art.

FIG. 3, a cross-sectional view taken along line 3—3 of FIG. 2 (i.e., from the direction of the air bearing surface ABS), illustrates the structure of the standard spin valve 16 of the prior art. The spin valve 16 includes a free layer 18, a spacer layer 20, a pinned layer 22, and an antiferromagnetic (AFM) layer 24. The spin valve 16 is supported by an insulating substrate 17 and a buffer layer 19 which can perform as a seed layer for the formation of the free layer 18 during fabrication. Ferromagnetic end regions 21, which operate as a hard bias, abut the ends of the spin valve 16 and provide stabilization of the free layer 18. Leads 25, typically made from gold or another low resistance material, allow the spin valve 16 to be joined to an electronic circuit. A capping layer 27 is provided over the AFM layer 24. A current source 29 is connected to leads 25 and provides a current $I_S$ that flows through the various layers of the standard spin valve 16. A changing magnetic field impinging upon the spin valve 16 creates a detectable change in the resistance of the spin valve 16 to the passage of an electrical current $I_S$. A signal detection circuit 31, also in electric communication with the spin valve 16, is configured to detect changes in the resistance of the spin valve 16.

The free and pinned layers are typically made from a soft ferromagnetic material such as permalloy. As is well known to those skilled in the art, permalloy is a magnetic material nominally including 81% nickel (Ni) and 19% iron (Fe). The spacer layer 20 should be made of an electrically conductive non-magnetic material such as copper (Cu). The AFM layer 24 is used to set the magnetization orientation of the pinned layer 22, as will be discussed in greater detail below. The antiferromagnetic material of the AFM layer 24 is typically either a manganese (Mn) alloy such as iron-manganese (FeMn) or an oxide such as nickel-oxide (NiO). The AFM layer 24 prevents the magnetization of the pinned layer 22 from changing its orientation appreciably under most operating conditions, with the result being that only the orientation of the magnetization of the free layer 18 may vary in response to an external magnetic field.

FIG. 4 shows the free layer 18, the spacer layer 20, and the pinned layer 22 of standard spin valve 16. As can be seen in FIG. 4, the free layer 18 can have an actual free magnetization direction 26, while the pinned layer 22 has a pinned magnetization direction 28. The free layer 18 may have an initial free magnetization 30 in the absence of four factors, the magnetostatic coupling of the pinned layer 22, the exchange coupling through the spacer layer 20, the field generated by the sensing current $I_S$, and any external fields. The actual free magnetization direction 26 is the sum of the initial free magnetization 30, the magnetostatic coupling of the pinned layer 22, the exchange coupling through the spacer layer 20, and the field generated by the sensing current $I_S$. Therefore, the actual free magnetization direction 26 may be thought of as the direction that the magnetization orientation of free layer 18 will tend to return to in the absence of any external fields. As is known in the art, varying external fields, such as may be produced by a nearby magnetic medium, will preferably cause the magnetization direction of the free layer 18 to vary in response thereto, causing the electrical resistance of spin valve 16 to measurably change.

In order to achieve higher signal-to-noise ratios than those obtainable with a standard spin valve 16, dual spin valves have been developed. A typical design for a dual spin valve 40 of the prior art is shown in FIG. 5A. Dual spin valve 40 includes a first AFM layer 41, a first pinned layer 42, a first spacer 43, a free layer 44, a second spacer layer 45, a second pinned layer 46, and a second AFM layer 47. Just as with spin valve 16, the magnetization 48 of the first pinned layer 42 is substantially fixed in a particular direction by being exchange-coupled to AFM layer 41 having a fixed magnetization orientation 49. Similarly, the magnetization 50 of the second pinned layer 46 is substantially fixed in a particular direction by being exchange-coupled to AFM layer 47 having a fixed magnetization orientation 51. The dual spin valve 40 provides greater signal by approximately a factor or two.

One distinct problem with dual spin valve 40 is that the current $I_S$, as it passes through the dual spin valve 40, creates its own magnetic field. It is well known that an electric current flowing through a conductor induces a magnetic field around the conductor. The orientation of that magnetic field is everywhere tangential to a circle around the conductor. Consequently, the current $I_S$, as it passes through the dual spin valve 40 induces a circular magnetic field, as shown in FIG. 5B. In FIGS. 5A and 5B the current $I_S$ is shown as passing perpendicular to the plane of the drawing and oriented towards the reader as indicated by a circled dot. The induced magnetic field shown in 5B will there reinforce or enhance the magnetization 50 of pinned layer 46 while simultaneously opposing or degrading the magnetization 48 of pinned layer 42. If the direction of current $I_S$ is reversed then magnetization 50 will be opposed while magnetization 48 will be reinforced.

The reinforcement of the magnetization of the pinned layer in one spin valve is desirable, however, the opposition to the magnetization of the pinned layer in the other spin valve can create problems. Specifically, the antiferromagnetic layers 41 and 47 are sensitive to temperature, such that if heated above a certain threshold, commonly known as the blocking temperature Tb, the spins of the valence electrons within the material are no longer coupled and the magnetization of the material is lost. Typical blocking temperatures for many antiferromagnetic materials are in the range of 160° C. to 200° C. Therefore, as a dual spin valve 40 is heated, whether because the interior of the drive warms with use, or because of electrostatic discharges (ESD), or because of frictional heating cause by infrequent collisions between the transducer 7 and surface irregularities on the magnetic disk 3, the antiferromagnetic layers 41 and 47 may approach or exceed their blocking temperatures. If the blocking temperature is exceeded than an antiferromagnetic layer 41 or 47 loses its magnetization, then the associated pinned layer 42 or 46 will no longer be pinned and will have a magnetization orientation that is free to vary.

However, even if the blocking temperature is not exceeded, as a antiferromagnetic layer 41 or 47 approaches its blocking temperature the strength of the exchange-coupling with the adjoining pinned layer 42 or 46 weakens. If the magnetization of the pinned layer 42 or 46 is opposed by the induced magnetic field created by the current $I_S$ and the exchange-coupling strength is weak, the pinning may be overcome. Consequently, it is possible that, even though the blocking temperature of an antiferromagnetic layer 41 or 47 has not been exceeded, the adjoining pinned layer 42 or 46 may lose its fixed magnetization orientation 48 or 50. Should this occur within a spin valve that is part of a sensor, then the ability to rely on a changing resistance of the spin valve as a measure of a changing external magnetic field is lost and the sensor ceases to function.

A more complex spin valve design is illustrated in FIG. 6. FIG. 6 shows a synthetic spin valve 60 consisting of an AFM layer 61, two pinned layers 62 and 63 separated by a first spacer layer 64, a second spacer layer 65, and a free layer 66. The thickness of the first spacer layer 64 is important because for a certain range of thicknesses the pinned layers 62 and 63 on either side of the first spacer layer 64 will become antiferromagnetically coupled. As such, the magnetization 67 of pinned layer 62 will be parallel, but oppositely oriented to, the magnetization 68 of pinned layer 63. The antiferromagnetic coupling across the first spacer layer 64 is very stable and therefore difficult to overcome. The strength of this coupling provides an advantage to the synthetic spin valve 60 where an induced magnetic field from the sense current $I_S$ opposes the magnetization direction of the second pinned layer 63.

A dual spin valve may also be made from two synthetic spin valves 60 that share a common free layer 66 to take advantage of the greater sensitivity of dual spin valves over single spin valves. In order for such a dual spin valve to have this greater sensitivity it is necessary that the magnetization orientation 68 of the pinned layer 63 on one side of the free layer 66 be parallel to the magnetization orientation 68 of the pinned layer 63 on the other side of the free layer 66. The requirement that the magnetization orientations 68 of the pinned layers 63 on either side of the free layer 66 are parallel to one another imposes a restriction that the magnetization orientations 67 of the pinned layers 62 on either side of the free layer 66 are also parallel one another. Unfortunately, when a sense current is introduced, the induced magnetic field will be oriented parallel to the magnetization orientation 67 of the pinned layer 62 in one synthetic spin valve 60, while simultaneously being antiparallel to the magnetization orientation 67 of the pinned layer 62 in the other synthetic spin valve 60. Consequently, no matter which way the sense current is oriented, in one of the two synthetic spin valves 60 the magnetization of the pinned layer 67 will be opposed by the induced magnetic field of the sense current $I_S$. As discussed above, when a sense current $I_S$ induces a magnetic field oriented antiparallel to a magnetization orientation of a pinned layer, the fixed magnetization may become unpinned as temperatures approach the blocking temperature for the material. Therefore, in a dual spin valve comprising two synthetic spin valves 60, one of the two synthetic spin valves 60 will always be subject to thermal instability resulting in a reduction in the signal strength of the device.

FIG. 7 shows yet another variation of a dual spin valve in which a standard spin valve 16 is joined with a synthetic spin valve 60. In FIG. 7 a hybrid dual spin valve 70 has a first antiferromagnetic layer 71, a first pinned layer 72, a spacer layer 73, a free layer 74, a second spacer layer 75, a second pinned layer 76 and a third pinned layer 77 separated by a third spacer layer 78, and a second antiferromagnetic layer 79. The first antiferromagnetic layer 71 has a magnetization direction 80 that pins the magnetization direction 81 of the first pinned layer 72 such that magnetization direction 81 is substantially parallel to magnetization direction 80. As with the synthetic spin valve 60, the second antiferromagnetic layer 79 has a magnetization direction 82 that pins the magnetization direction 83 of the third pinned layer 77 such that magnetization direction 83 is substantially parallel to magnetization direction 82, and also pins the magnetization direction 84 of the second pinned layer 76 such that magnetization direction 84 is substantially antiparallel to magnetization direction 82. Further, magnetization directions 83 and 84 are antiferromagnetically coupled across the third spacer layer 78.

The hybrid dual spin valve 70 is advantageous for several reasons. Firstly, the first and second pinned layers 72 and 76 on either side of free layer 74 have substantially parallel magnetization direction 81 and 84, thus a sensor incorporating such hybrid dual spin valve 70 should provide roughly twice the signal as a spin valve 16. Unlike the dual spin valve 40, or a dual synthetic spin valve, the hybrid dual spin valve 70 may be arranged such that when a current $I_S$ is introduced the induced magnetic field reinforces the magnetization 81 of the first pinned layer 72 and also reinforces the magnetization 83 of the third pinned layer 77. Thus, a hybrid dual spin valve 70 has greater thermal stability as well as improved sensitivity to external magnetic fields.

In order for a hybrid dual spin valve 70 to work well, the magnetization orientations 80 and 82 of the first and second antiferromagnetic layers 71 and 79 should be antiparallel to one another. Setting the magnetization orientations 80 and 82 of two antiferromagnetic layers 71 and 79 in antiparallel directions has not been easy to accomplish. One approach is described by Gill in U.S. Pat. No. 5,748,399 and involves the use of pulses of electric current to establish the magnetization orientations of the antiferromagnetic layers. The invention set forth in the aforementioned patent discloses that a pulse of sufficient duration and magnitude may heat the antiferromagnetic layer beyond its blocking temperature and that the magnetic field of the pulse may establish the magnetization orientation of the antiferromagnetic layer. Antiparallel orientations may then be achieved by sending electric pulses through both antiferromagnetic layers in antiparallel directions. Unfortunately, this method of resetting the magnetization orientations has several disadvantages. For example, a sensor incorporating such a system needs additional electronics to monitor the magnetization orientations of the antiferromagnetic layers and to periodically administer pulses of electric current when those magnetization orientations stray too far from their ideal directions. Further, the sensor can not operate while pulses are being applied, the electric pulses require an expenditure of additional energy, and the pulses heat the sensor by heating the antiferromagnetic layers. Such repeated heating may cause diffusion across the interfaces between the layers of the sensor causing those interfaces to degrade, ultimately lessening the sensitivity of the sensor. A further disadvantage of this technique is that the antiferromagnetic layers must be made from materials having low blocking temperatures so that the administered electric pulses can eat the layers sufficiently to allow their magnetization orientations to reset (high blocking temperature materials such as NiMn and PtMn require long-term annealing at high temperatures to set their pinning direction). However, antiferromagnetic layers made of low blocking temperature materials will inherently be more susceptible to thermal instabilities and therefore will require resetting more frequently, potentially lessening the life expectancy of the device due to the aforementioned diffusion problem.

What is desired, therefore, is a hybrid dual spin valve sensor for reading magnetic data that has antiferromagnetic layers made of high blocking temperature materials and with magnetization orientations permanently set antiparallel to one another and a method for producing the same.

SUMMARY OF THE INVENTION

The present invention provides a hybrid dual spin valve sensor for reading magnetic data that has antiferromagnetic layers with magnetization orientations permanently set antiparallel to one another, and a method for making the same.

One embodiment of the present invention provides a hybrid dual spin valve magnetoresistive read sensor. The hybrid dual spin valve sensor comprises a hybrid dual spin valve, a lead set, a current source, and a signal detection circuit. The hybrid dual spin valve comprises a 9 layer structure including, in order, a first antiferromagnetic layer, a first soft ferromagnetic layer, a first spacer layer, a free layer, a second spacer layer, a second soft ferromagnetic layer, a third spacer layer, a third soft ferromagnetic layer, and a second antiferromagnetic layer. The first antiferromagnetic layer has a magnetization orientation in a first direction and the first soft ferromagnetic layer has a magnetization orientation pinned substantially parallel to that first direction by the first antiferromagnetic layer. The second soft ferromagnetic layer has a second magnetization orientation, the third soft ferromagnetic layer has a third magnetization orientation, and the second antiferromagnetic layer has a fourth magnetization orientation. The fourth magnetization orientation is in a direction substantially antiparallel to the first direction, and consequently the second antiferromagnetic layer pins the third magnetization orientation of the third soft ferromagnetic layer also in a direction substantially antiparallel to the first direction. The third soft ferromagnetic layer and the second soft ferromagnetic layer are exchange-coupled such that the second magnetization orientation is maintained in a direction substantially parallel to the first direction. The first, second, and third spacer layers are formed of a conductive material, while the free layer is formed of a soft ferromagnetic material.

In a further embodiment, the first antiferromagnetic layer is formed of an antiferromagnetic material with a first blocking temperature and the second antiferromagnetic layer is formed of an antiferromagnetic material with a second blocking temperature. In additional embodiments the first antiferromagnetic layer is formed of IrMn and the second antiferromagnetic layer is formed of PtMn.

Another embodiment of the present invention provides a read/write head for accessing and storing data on a magnetic medium. The read/write head includes the hybrid dual spin valve magnetoresistive read sensor of the present invention along with an inductive write element. Yet another embodiment provides a magnetic data storage and retrieval system. The system comprises the read/write head of the present invention, a suspension system, and a magnetic medium. The suspension system supports the read/write head over the magnetic medium. In a further embodiment of the magnetic data storage and retrieval system the magnetic medium is rotatably supported under the read/write head and coupled to a motor for rotation about an axis.

The hybrid dual spin valve of the present invention, where each antiferromagnetic layer is made of an antiferromagnetic material with a different blocking temperature, is advantageous over the prior art because the magnetization orientations of the two antiferromagnetic layers may be conveniently and permanently set antiparallel to one another. The magnetization orientations of the two antiferromagnetic layers, once set, permanently pin the magnetization orientations of each of the soft ferromagnetic layers except for the free layer. Therefore, the electrical resistance of the hybrid dual spin valve is a simple function of the magnetization orientation of the free layer, which may vary in response to external magnetic fields. Consequently, the hybrid dual spin valve sensor, the read/write head, and the magnetic data storage and retrieval system all share the advantage of a hybrid dual spin valve having antiferromagnetic layers permanently set antiparallel to one another.

Another embodiment of the present invention includes a method for forming a hybrid dual spin valve magnetoresistive read sensor. The method includes providing a hybrid dual spin valve, fixing a magnetization orientation of a first antiferromagnetic layer, fixing a magnetization orientation of a second antiferromagnetic layer, attaching a lead set formed of a conductive material to the spin valve, attaching a current source to the lead set, and attaching a signal detection circuit to the lead set, wherein the signal detection circuit is configured to detect changes in the electrical resistance of the hybrid dual spin valve.

In a further embodiment of the method, fixing a magnetization orientation of the first antiferromagnetic layer further includes heating the hybrid dual spin valve to a first temperature, placing the spin valve within a first external magnetic field having a first orientation for a time sufficient to allow the first antiferromagnetic layer to acquire a magnetization orientation substantially parallel to the first orientation of the first external magnetic field, and cooling the spin valve within the first external magnetic field to substantially fix the magnetization orientation. In yet another embodiment of the method, fixing a magnetization orientation of the second antiferromagnetic layer further includes heating the hybrid dual spin valve to a second temperature, placing the spin valve within a second external magnetic field having a second orientation for a time sufficient to allow the second antiferromagnetic layer to acquire a magnetization orientation substantially parallel to the second orientation of the second external magnetic field, and cooling the spin valve within the second external magnetic field to substantially fix the magnetization orientation. Other embodiments of the method are directed to alternatives in which the first temperature may be either above or near the first blocking temperature, the second temperature may be either above or near the second blocking temperature, and in which the first blocking temperature may be above or below the second blocking temperature.

The method of the present invention is advantageous over the prior art in that it provides simple processes for permanently fixing the magnetization orientations of the two antiferromagnetic layers in substantially antiparallel directions. This is accomplished by fixing the magnetization orientation of the antiferromagnetic layer with the lower blocking temperature after setting the magnetization orientation of the antiferromagnetic layer with the higher blocking temperature. Because of the difference in the two blocking temperatures, the magnetization orientation of the antiferromagnetic layer with the lower blocking temperature can be fixed without altering the previously set magnetization orientation of the antiferromagnetic layer with the higher blocking temperature. The option of heating the spin valve to either above or near the blocking temperatures of the antiferromagnetic layers provides flexibility to the method by allowing the magnetization orientations of the antiferromagnetic layers to be set at either higher or lower temperatures. The choice of processing temperatures may depend, for example, on the temperature difference between the two blocking temperatures, or on other materials related considerations such as the need to keep processing temperatures below a solder eutectic temperature.

These and other advantages of the present invention will become apparent to those skilled in the art upon a reading of the following descriptions of the invention and a study of the several figures of the drawing.

DETAILED DESCRIPTION OF THE PREFERRED EMBODIMENTS

FIGS. 1A, 1B, 2–4, 5A, 5B, 6, and 7 were discussed with reference to the prior art.

Figure 1A:
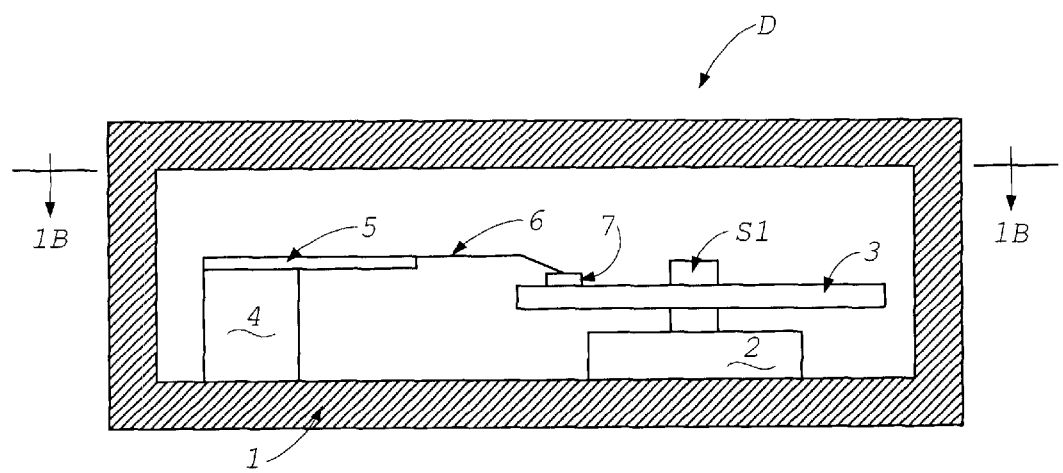
FIG. 1A is a partially sectioned, front elevation view of a magnetic disk drive assembly.
Figure 1B:
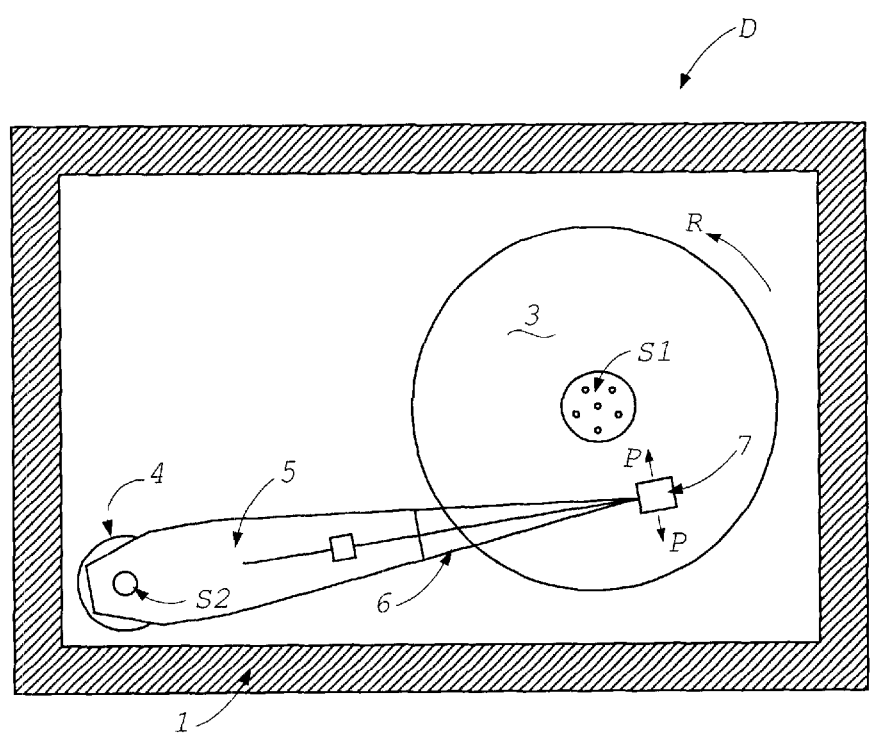
FIG. 1B is a cross section taken along line 1B—1B of FIG. 1A.
Figure 2:
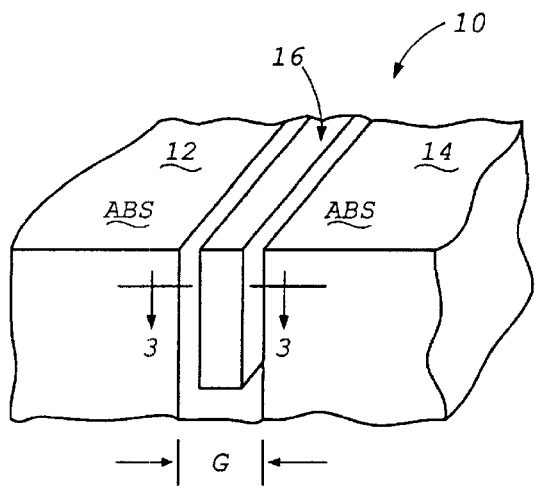
FIG. 2 is a perspective view of a prior art shielded vertical magnetoresistive spin valve sensor head.
Figure 3:
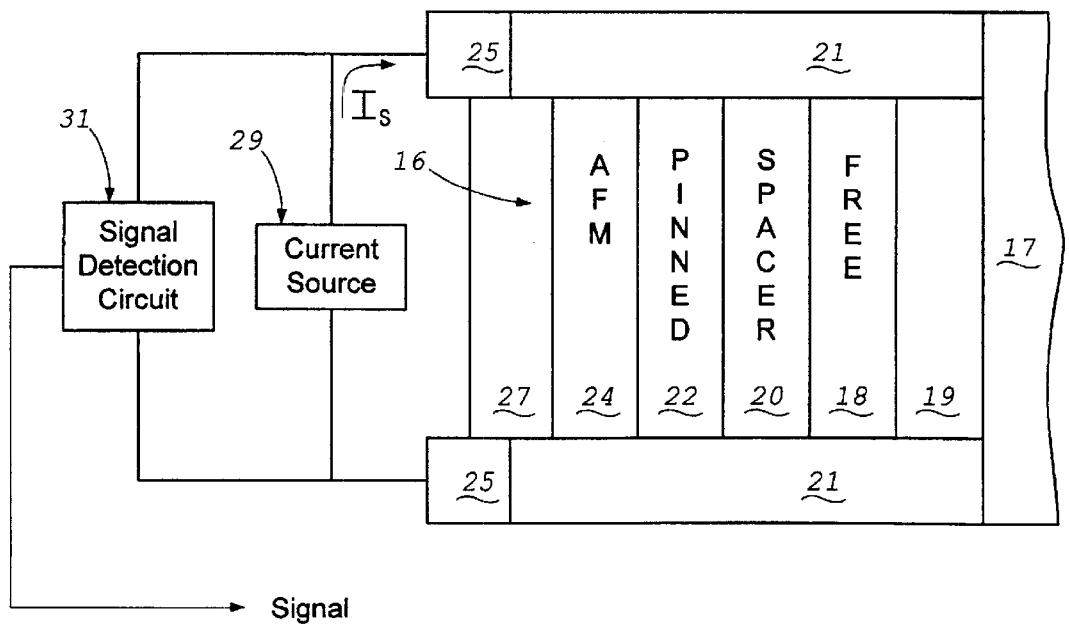
FIG. 3 is a cross-sectional view of a spin valve sensor of the prior art taken along line 3—3 of FIG. 2.
Figure 4:
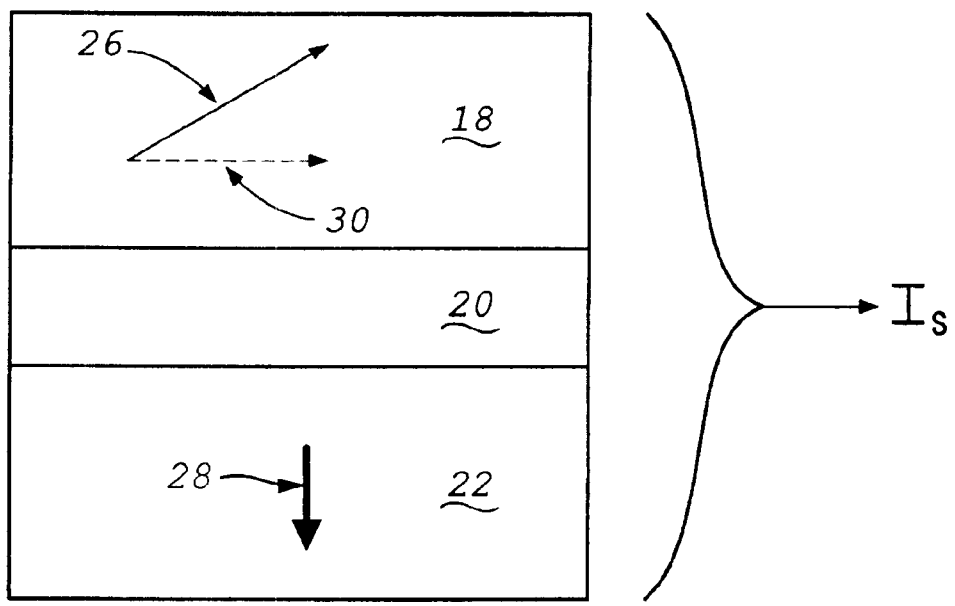
FIG. 4 illustrates the magnetic moment direction of the free and pinned layers of the spin valve sensor of FIG. 3.
Figure 5A:
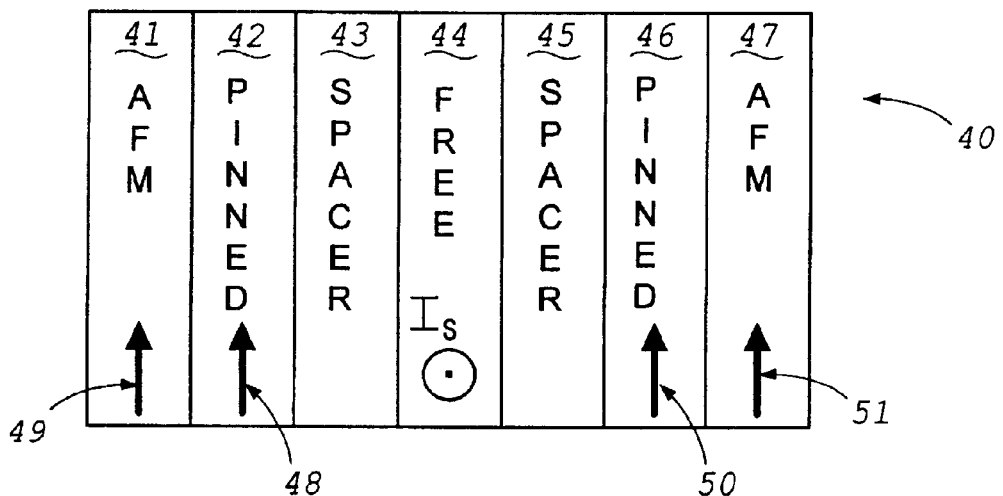
FIG. 5A is a cross-sectional view of a prior art dual spin valve.
Figure 5B:
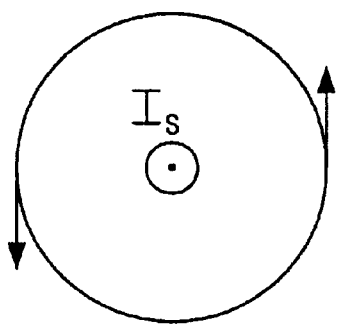
FIG. 5B is a representation of the arrangement of a magnetic field induced by an electric current flowing in a straight line.
Figure 6:
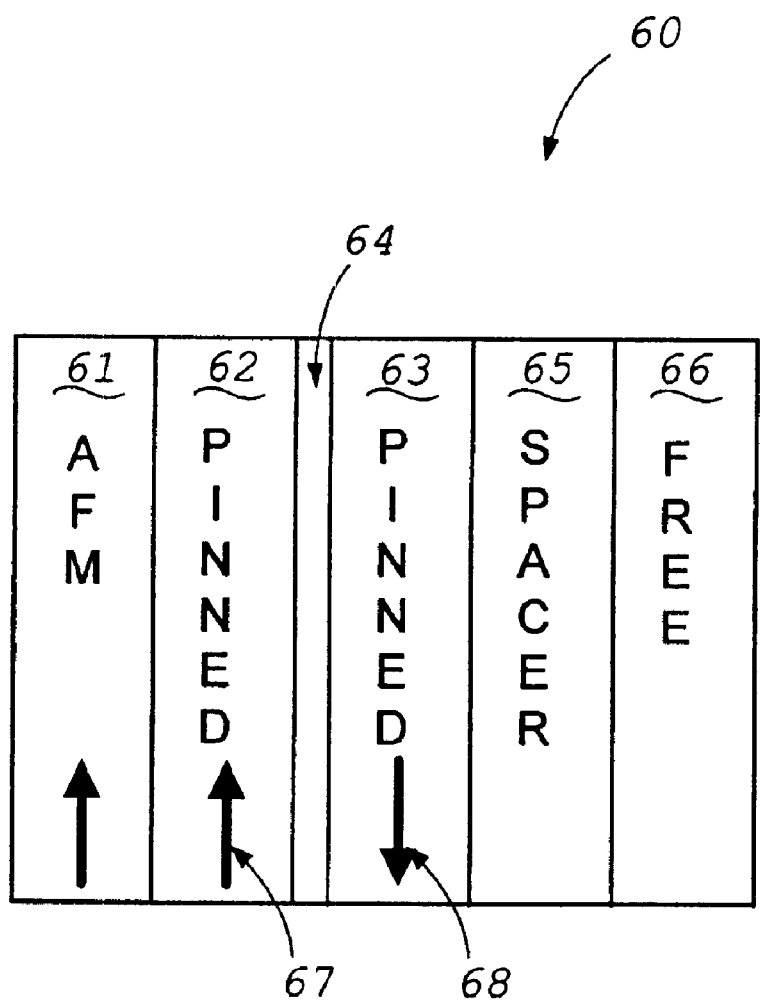
FIG. 6 is a cross-sectional view of a prior art synthetic spin valve.
Figure 7:
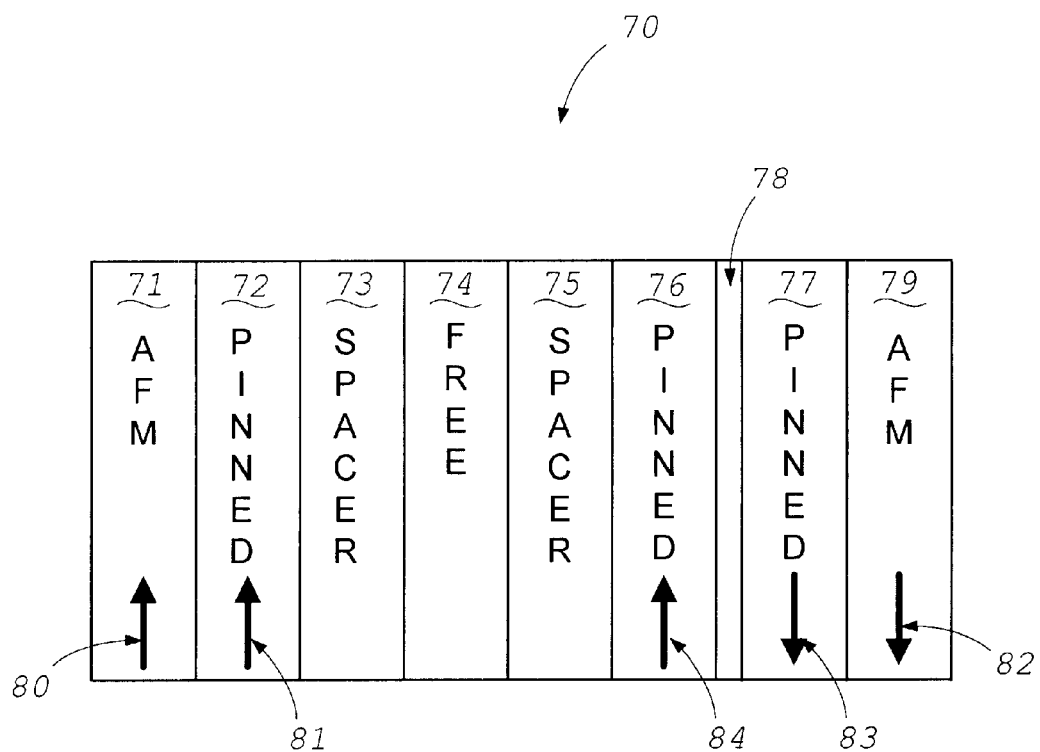
FIG. 7 is a cross-sectional view of a hybrid dual spin valve combining standard and synthetic spin valves.
Figure 8:
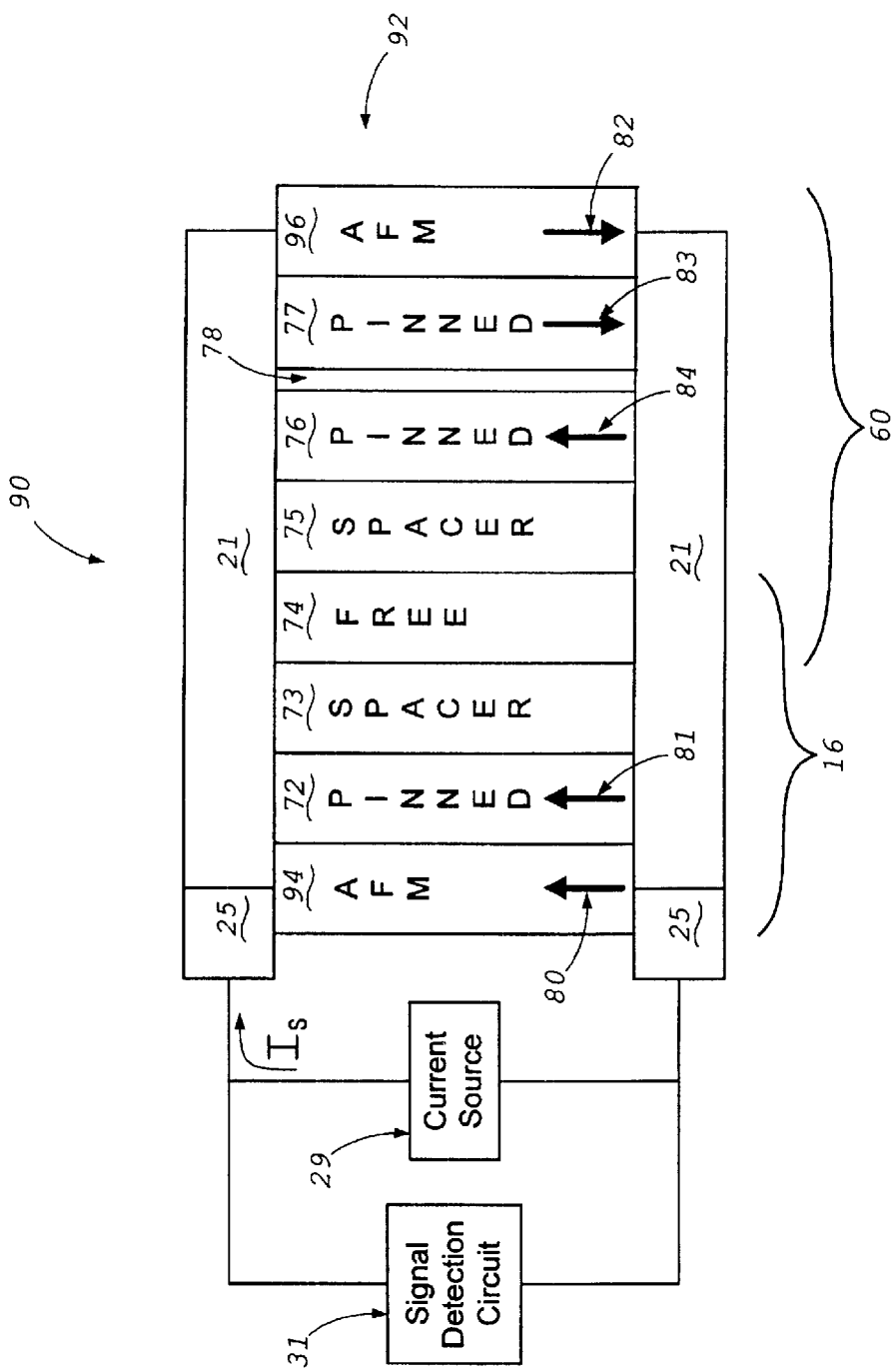
FIG. 8 is a cross-sectional view of the hybrid dual spin valve sensor of the present invention.

FIG. 8 shows a hybrid dual spin valve sensor 90 of the present invention. The sensor 90 includes a hybrid dual spin valve 92, ferromagnetic end regions 21, leads 25, a current source 29, and a signal detection circuit 31. The ferromagnetic end regions 21 operate as a hard bias and abut the ends of the hybrid spin valve 92. The leads 25 allow the hybrid spin valve 92 to be joined to the current source 29 and the signal detection circuit 31. The current source 29 provides to the hybrid dual spin valve 92 a sense current $I_S$ that encounters a resistance from the spin valve 92 that varies as a function of the relative orientations of the magnetizations of the magnetic layers. The signal detection circuit 31 is configured to detect changes in the electrical resistance of the spin valve 92 as the sense current $I_S$ passes through it.

The hybrid dual spin valve 92 comprises a standard spin valve 16 sharing a common free layer 74 with a synthetic spin valve 60. The standard spin valve 16 consists of a first antiferromagnetic layer 94 having a first blocking temperature, a first soft ferromagnetic layer 72, a first spacer layer 73, and the common free layer 74. The synthetic spin valve 60 consists of the common free layer 74, a second spacer 75, a second soft ferromagnetic layer 76, a third spacer layer 78, a third soft ferromagnetic layer 77, and a second antiferromagnetic layer 96 having a second blocking temperature. Each of the two antiferromagnetic layers 94 and 96 has a fixed magnetization orientation 80 and 82 set antiparallel to one another. The antiferromagnetic layers 94 and 96 may be made from any two different antiferromagnetic materials chosen from the group including FeMn, IrMn, NiO, CoO, NiCoO, NiMn, PtMn, PtPdMn, CrPtMn, and CrMn. Choosing two antiferromagnetic materials with different blocking temperatures is necessary, and it is preferable to choose materials with blocking temperatures that are significantly different. Combinations where the low blocking temperature material is selected from the group including FeMn, IrMn, NiO, CoO, and NiCoO and the high blocking temperature material is selected from the group including NiMn, CrMn, PtMn, PtPdMn, and CrPtMn work well for the present invention. It is not important to the present invention whether the higher blocking temperature antiferromagnetic material is used for the antiferromagnetic layer 94 of the standard spin valve 16, or the antiferromagnetic layer 96 of the synthetic spin valve 60. The antiferromagnetic layers 94 and 96 may be formed by sputtering, ion beam deposition, or by evaporation and preferably should be in a thickness range of 30 Å to 600 Å.

The first, second, and third soft ferromagnetic layers 72, 76, and 77 may be made from any soft ferromagnetic material such as NiFe, CoFe, Co, or any alloy in the nickel-iron-cobalt ternary system, with CoFe working well for the present invention. Layers 72, 76, and 77 may be formed by sputtering, ion beam deposition, or by evaporation and preferably should be in a thickness range of 5 Å to 40 Å.

The spacer layers 73 and 75 may be made from any conductive non-magnetic material, with copper (Cu) known to work well. Layers 73 and 75 may be formed by sputtering, ion beam deposition, or by evaporation and preferably should be in a thickness range of 15 Å to 30 Å. The spacer layer 78 may also be made from any conductive non-magnetic material, with ruthenium (Ru) being a good choice. Layer 78 may be formed by sputtering, ion beam deposition, or by evaporation and preferably should be in a thickness range of 2 Å to 12 Å.

The free layer 74 may be made from any soft ferromagnetic material such as NiFe, CoFe, Co, or any alloy in the nickel-iron-cobalt ternary system. Good results have been obtained with a single layer of CoFe as well as with a multilayer comprising a three layer stack in which a layer of NiFe is sandwiched between two layers of CoFe. The CoFe/NiFe/CoFe multilayer works well due to reasons of enhanced spin dependent scattering and thermal stability. Layer 74 may be formed by sputtering, ion beam deposition, or by evaporation and preferably should be in a thickness range of 10 Å to 80 Å.

As previously noted, the sensor 90 of the present invention also includes a lead set 25. The leads 25 are formed of a conductive material such as gold (Au) and are electrically connected to the hybrid dual spin valve 92. The lead set 25 should be configured such that the sensing current $I_S$ may flow through the pinned layers 72 and 77, the spacer layers 73, 75, and 78, and the free layer 74. In order to reach all of the conductive layers the sense current $I_S$ may also pass through the ferromagnetic end regions 21. Processes for the formation and attachment of the leads 25 are well known in the art. The specifics of the leads 25 are therefore not important to the proper understanding of the present invention.

The current source 29 and the signal detection circuit 31 are both electrically connected to the lead set 25 as shown in FIG. 8. The current source 29 should be able to provide a constant sense current $I_S$ to the hybrid dual spin valve 92. The signal detection circuit 31 should be sensitive to minor changes in electrical resistance within the hybrid dual spin valve 92. As with the lead set 25, the specifics of the current source 29 and the signal detection circuit 31 are not important to the proper understanding of the present invention as both are well known in the art.

Additional embodiments of the present invention include a read/write head 7 for accessing and storing data on a medium 3 and a magnetic data storage and retrieval system.

The read/write head 7 combines an inductive write element with the above described hybrid dual spin valve sensor 90. Read/write heads including both an inductive write element and a magnetorestrictive read element are well known in the art. The magnetic data storage and retrieval system of the present invention includes a read/write head 7 connected to a suspension 6 for supporting the read/write head 7 over the magnetic medium 3. The read/write head 7 includes an inductive write element and a hybrid dual spin valve magnetoresistive read sensor 90 as described. Preferably, the magnetic medium 3 of the magnetic data storage and retrieval system is rotatably supported under the read/write head and coupled to a motor 2 for rotation about an axis. Again, magnetic data storage and retrieval systems including read/write heads 7, rotatably mounted magnetic media 3, and suspension systems 6 are well known in the art.

Figure 9:
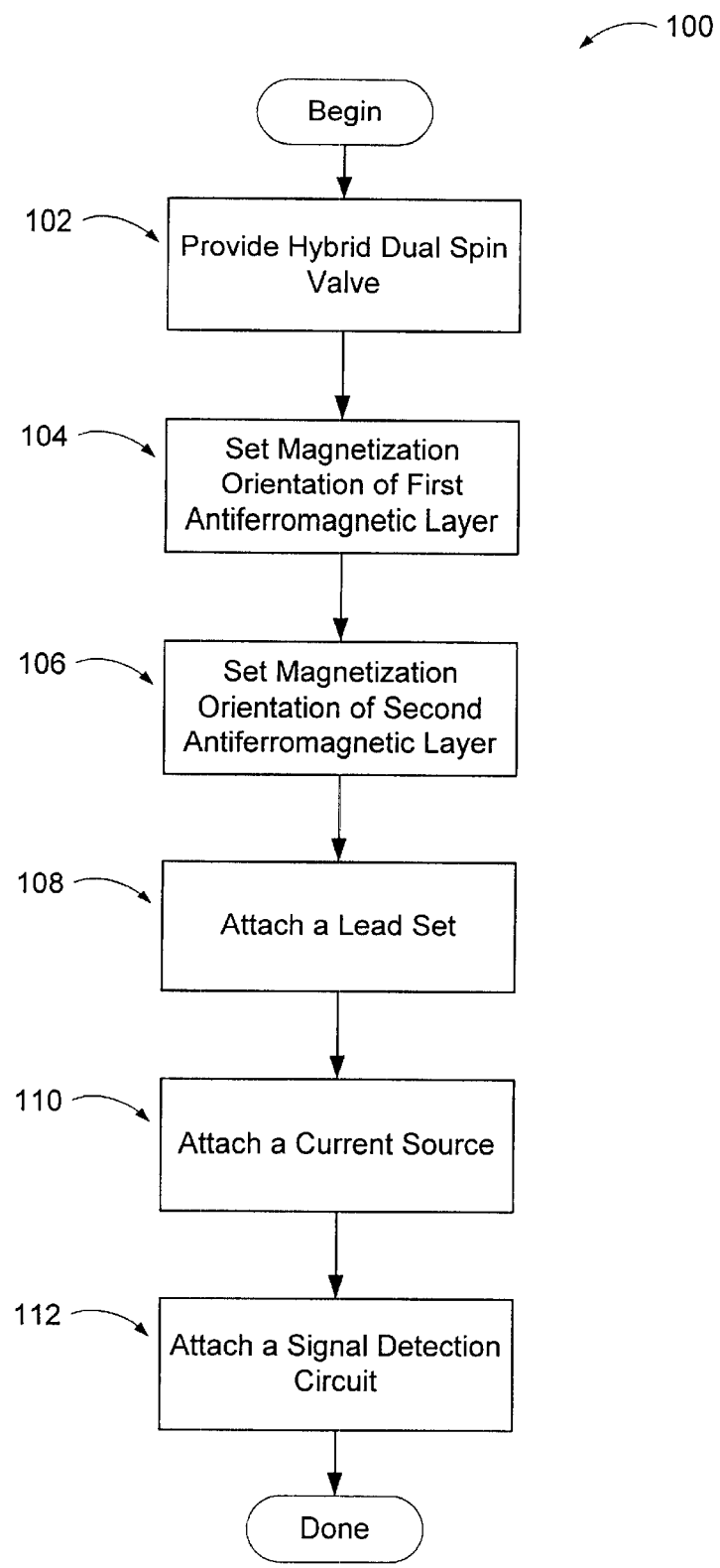
FIG. 9 is a process diagram for producing a hybrid dual spin valve sensor according to the method of the present invention.

Further embodiments of the present invention are directed towards a method 100 for forming a hybrid dual spin valve magnetoresistive read sensor. The method 100 is illustrated in the process diagram of FIG. 9. Method 100 includes providing a hybrid dual spin valve 92 in act or operation 102, setting a magnetization orientation 80 of the first antiferromagnetic layer 94 in act or operation 104, setting a magnetization orientation 82 of the second antiferromagnetic layer 96 in act or operation 106, attaching a lead set 25 in act or operation 108, attaching a current source 29 in act or operation 110, and attaching a signal detection circuit 31 in act or operation 112.

In act or operation 102 a hybrid dual spin valve 92 is provided. The hybrid dual spin valve 92 consists of the aforementioned structure described above with reference to FIG. 8. As provided in act or operation 102 the antiferromagnetic layers 94 and 96 of the hybrid dual spin valve 92 do not have the desired magnetization orientations 80 and 82. Consequently, in order for the hybrid dual spin valve sensor 90 to function optimally, it is necessary to orient the magnetizations of the two antiferromagnetic layers 94 and 96 such that they are substantially antiparallel to one another. The magnetizations of the two antiferromagnetic layers 94 and 96 are therefore set in acts or operations 104 and 106.

In act or operation 104 the magnetization orientation 80 of the first antiferromagnetic layer 94 is set according to a process 120. Likewise, in act or operation 106 the magnetization orientation 82 of the second antiferromagnetic layer 96 is set, also by the process 120. Process 120 will be described below with reference to FIG. 10.

In act or operation 108 the lead set 25 is attached to the hybrid dual spin valve 92. Various methods for attaching leads to thin film devices are well known in the art, and the specific method used in act or operation 108 is not important to the present invention. Similarly, the current source 29 is attached to the leads 25 in act or operation 110. Methods for attaching a current source 29 to leads 25 are well understood in the art and include, for example, extending from the current source 29 electrically conductive wires that may be soldered to the leads 25. Alternately, a printed circuit may be used to join the current source 29 to the leads 25. Likewise, the signal detection circuit 31, attached in act or operation 112, may be accomplished by any of the methods known in the art.

It is important to note that the acts or operations within method 100 need not be followed in the given order to stay within the present invention. For example, the lead set 25 may be attached in act or operation 108 before the magnetization orientation 80 is fixed in act or operation 104.

However, it is important to the present invention that the antiferromagnetic layer 94 or 96 with the higher blocking temperature should have its magnetization orientation 80 or 82 set before setting the magnetization orientation 80 or 82 of the antiferromagnetic layer 94 or 96 with the lower blocking temperature. Consequently, if the blocking temperature of antiferromagnetic layer 96 is greater than that of antiferromagnetic layer 94, act or operation 106 must precede act or operation 104. It is not important to the present invention, however, which antiferromagnetic layer 94 or 96 has the higher blocking temperature.

Figure 10:
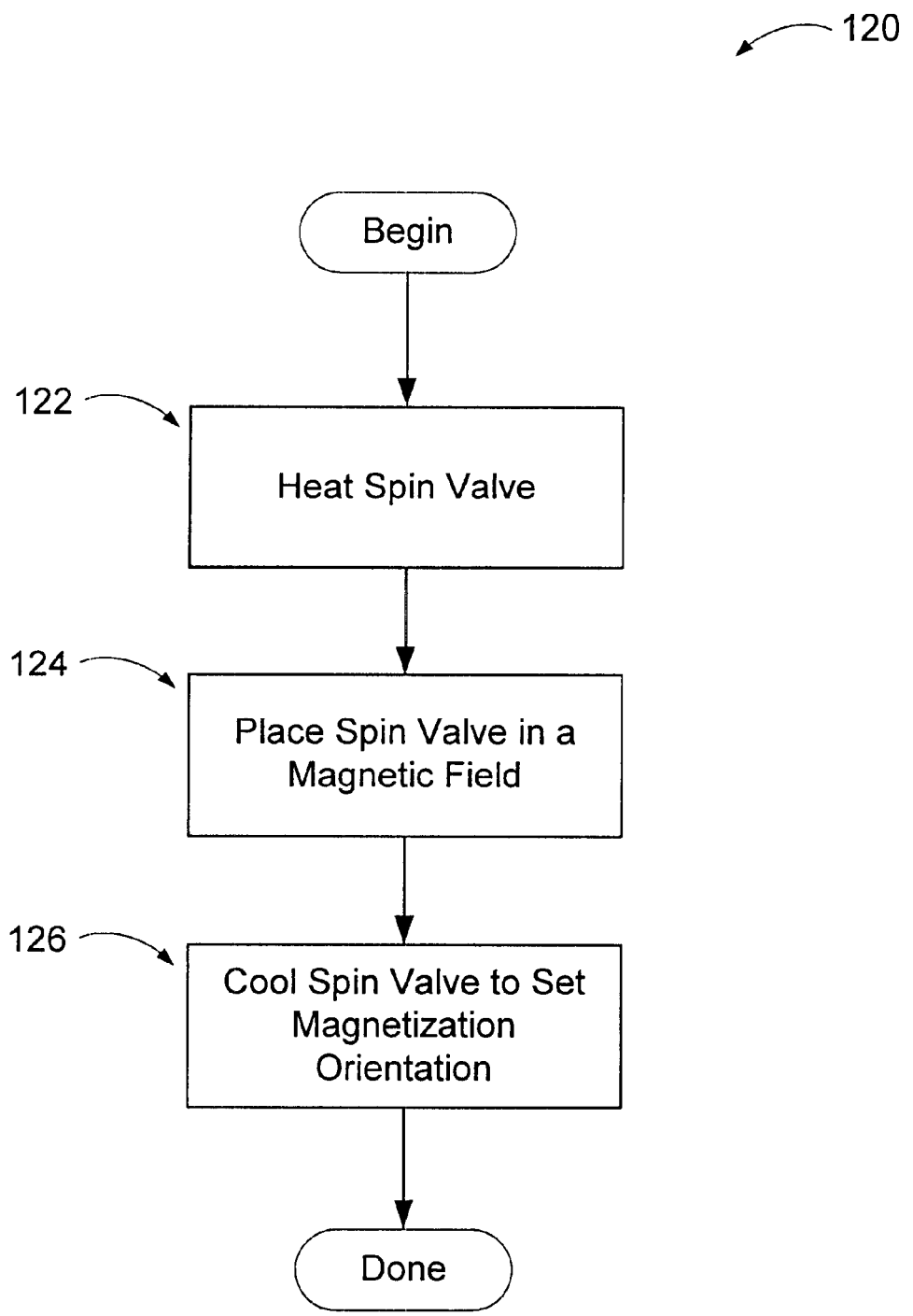
FIG. 10 is a process diagram for setting the magnetization orientation of an antiferromagnetic layer according to the method of the present invention.

FIG. 10 illustrates the process 120 for setting the magnetization orientations 80 and 82 of the first and second antiferromagnetic layers 94 and 96. Process 120 includes heating the hybrid dual spin valve 92 in act or operation 122, placing the spin valve 92 in a properly oriented magnetic field in act or operation 124, and cooling the spin valve 92 in act or operation 126.

In act or operation 122 the hybrid dual spin valve 92 is heated in an oven. Each antiferromagnetic layer 94 and 96 has a specific blocking temperature that will determine the temperature that the spin valve 92 must be heated to in act or operation 122. In one embodiment of the present invention the spin valve 92 is heated to a temperature above the blocking temperature of the antiferromagnetic layer 94 or 96 that is being processed. When the antiferromagnetic material is heated above its blocking temperature it loses its magnetization. Therefore, in this first embodiment of act or operation 122 heating above the blocking temperature is used to clear the antiferromagnetic layer 94 or 96 of any pre-existing magnetization orientation. In a second embodiment of the present invention the antiferromagnetic layer 94 or 96 is heated to a temperature near the blocking temperature. In the present context a temperature that is near the blocking temperature is one within a range of temperatures bounded at the high end by the blocking temperature itself. The range includes all temperatures below the blocking temperature at which a pre-existing magnetization may be readily reversed by an externally applied magnetic field in a commercially viable length of time.

The first embodiment of act or operation 122 may be desirable to quickly set the magnetization orientation 80 or 82 of the antiferromagnetic layer 94 or 96 being processed, where heating to a temperature above the blocking temperature of antiferromagnetic layer 94 or 96 does not adversely affect the spin valve 92 or any of the existing attachments to it that may necessarily also be heated. On the other hand, the second embodiment of act or operation 122 may be used to avoid such adverse affects of elevated temperatures. For example, if act or operation 108 precedes act or operation 104, and the blocking temperature of antiferromagnetic layer 94 is near or above the eutectic temperature of a solder used to attach the lead set 25, then heating the spin valve 92 to above the blocking temperature may cause the solder to melt and the attachments to fail. In such a case it may be more desirable to use the second embodiment of act or operation 122 to heat the spin valve 92 to near the blocking temperature rather than above it. Another possible reason to avoid temperatures above the blocking temperatures of antiferromagnetic layers 94 and 96 is to avoid diffusion across the interfaces between the layers of spin valve 92. Such diffusion can cause the interfaces to become less well defined, which may adversely affect the sensitivity of the spin valve 92.

In some instances, for example when the blocking temperatures of the two antiferromagnetic layers 94 and 96 are similar, it may be desirable to utilize the second embodiment of act or operation 122 for setting the magnetization 80 or 82 of the antiferromagnetic layer 94 or 96 having the lower blocking temperature. In such instances, heating to a temperature above the blocking temperature of the antiferromagnetic layer 94 or 96 with the lower blocking temperature may also mean heating to a temperature near the blocking temperature of the antiferromagnetic layer 94 or 96 with the higher blocking temperature. Consequently, setting the magnetization orientation 80 or 82 of the antiferromagnetic layer 94 or 96 at a temperature above the lower blocking temperature may cause the previously set magnetization orientation 80 or 82 of the antiferromagnetic layer 94 or 96 with the higher blocking temperature to be rotated.

In act or operation 124 the spin valve 92 is placed in a properly oriented magnetic field by either producing such an oriented magnetic field around the spin valve 92 or by moving the spin valve 92 to a location where such a magnetic field already exists. The magnetization orientations 80 and 82 of both antiferromagnetic layers 94 and 96 should be set to be substantially within the plane that lies perpendicular to the direction that the sense current $I_S$ will flow. It is further necessary that both magnetization orientations 80 and 82 be set substantially within the plane that a magnetization of the free layer 74 will move when responding to an external magnetic field. Two possible orientations satisfy these constraints, and those two possible orientations are antiparallel to one another. A properly oriented magnetic field for act or operation 124 may be either of these two possible orientations when setting the magnetization orientation of the antiferromagnetic layer 94 or 96 with the higher blocking temperature. For setting the magnetization orientation 80 or 82 of the antiferromagnetic layer 94 or 96 with the lower blocking temperature, a properly oriented magnetic field for act or operation 124 may only be the direction antiparallel to the one used to set the magnetization orientation 80 or 82 of the antiferromagnetic layer 94 or 96 with the higher blocking temperature.

The strength of the properly oriented magnetic field should be sufficient to set the magnetization orientation 80 or 82 within a commercially feasible length of time. This will be dependent on the temperature used in act or operation 122 as well as the particular antiferromagnetic material selected. The properly oriented magnetic field must be strong enough to saturate the exchange pinning, in other words it must be greater than the sum of the exchange field and the coercivity of the exchange loop. The strength of the properly oriented magnetic field can range from 500 Oe to 1000 Oe.

The length of time spin valve 92 must remain in the properly oriented magnetic field will also depend on the temperature used in act or operation 122 as well as the particular antiferromagnetic material selected. For most antiferromagnetic materials a few minutes to about an hour will suffice. However, for materials such as PtMn, NiMn, and PtPdMn a phase transition has to occur in the material before the magnetization may be set. From approximately 5 to approximately 15 hours may be required to both achieve the phase transition and set the desired magnetization orientation 80 or 82.

In act or operation 126 the spin valve 92 is cooled while still within the properly oriented magnetic field of act or operation 124. This serves to freeze in place the magnetization orientation 80 or 82 that was established with the properly oriented magnetic field in act or operation 124. While the properly oriented magnetic field could be removed any time during the cooling process, if the spin valve 92 is not well below the blocking temperature some of the magnetic ordering may be lost. Consequently, for the present invention it has been found that it is best to maintain the properly oriented magnetic field until the spin valve 92 is cool enough to be removed from the oven.

In summary, the present invention provides a hybrid dual spin valve sensor 90 and a method 100 for producing the same. The hybrid dual spin valve 92 of sensor 90 includes antiferromagnetic layers 94 and 96 having different blocking temperatures. The method 100 takes advantage of the different blocking temperatures of the antiferromagnetic layers 94 and 96 to allow their magnetization orientations 80 and 82 to be set antiparallel to one another in two successive processes. While the invention has been described herein in terms of several preferred embodiments, other embodiments of the invention, including alternatives, modifications, permutations and equivalents of the embodiments described herein, will be apparent to those skilled in the art from consideration of the specification, study of the drawings, and practice of the invention. Therefore, the embodiments and preferred features described above should be considered exemplary, with the invention being defined by the appended claims, which therefore include all such alternatives, modifications, permutations and equivalents as fall within the true spirit and scope of the present invention.

What is claimed is:

1. A hybrid dual spin valve magnetoresistive read sensor, comprising:
    a hybrid dual spin valve including:
        a first antiferromagnetic layer formed of an antiferromagnetic material with a first Tb, having a magnetization orientation in a first direction,
        a first soft ferromagnetic layer positioned adjacent to said first antiferromagnetic layer and having a magnetization orientation pinned substantially parallel to said first direction by said first antiferromagnetic layer,
        a first spacer layer formed of a conductive material and positioned adjacent to said first soft antiferromagnetic layer,
        a free layer formed of a soft ferromagnetic material and positioned adjacent to said first spacer layer,
        a second spacer layer formed of a conductive material and positioned adjacent to said free layer,
        a second soft ferromagnetic layer having a second magnetization orientation and positioned adjacent to said second spacer layer,
        a third spacer layer formed of a conductive material and positioned adjacent to said second soft ferromagnetic layer,
        a third soft ferromagnetic layer having a third magnetization orientation and positioned adjacent to said third spacer layer, and
        a second antiferromagnetic layer formed of an antiferromagnetic material with a second Tb, positioned adjacent to said third soft ferromagnetic layer, having a fourth magnetization orientation in a direction that is substantially antiparallel to said first direction, said second antiferromagnetic layer pinning said third magnetization orientation of said third soft ferromagnetic layer in a direction substantially antiparallel said first direction, said third soft ferromagnetic layer and said second soft ferromagnetic layer being exchange-coupled such that said second magnetization orientation of said second soft ferromagnetic layer is maintained in a direction substantially parallel said first direction;
        a lead set formed of a conductive material and electrically connected to said hybrid dual spin valve;
    a current source electrically connected to said lead set; and
    a signal detection circuit electrically connected to said lead set and configured to detect changes in electrical resistance within said hybrid dual spin valve.

2. The hybrid dual spin valve magnetoresistive read sensor of claim 1, wherein said first antiferromagnetic layer is formed of a low blocking temperature antiferromagnetic material selected from the group including FeMn, IrMn, NiO, CoO and NiCoO, and said second antiferromagnetic layer is formed of a high blocking temperature antiferromagnetic material selected from the group including NiMn, CrMn, PtMn, PtPdMn, and CrPtMn.

3. The hybrid dual spin valve magnetoresistive read sensor of claim 1, wherein said second antiferromagnetic layer is formed of a low blocking temperature antiferromagnetic material selected from the group including FeMn, IrMn, NiO, CoO and NiCoO, and said first antiferromagnetic layer is formed of a high blocking temperature antiferromagnetic material selected from the group including NiMn, CrMn, PtMn, PtPdMn, and CrPtMn.

4. The hybrid dual spin valve magnetoresistive read sensor of claim 1, wherein said first antiferromagnetic layer is formed of IrMn, and said second antiferromagnetic layer is formed of PtMn.

5. The hybrid dual spin valve magnetoresistive read sensor of claim 1, wherein said second antiferromagnetic layer is formed of IrMn, and said first antiferromagnetic layer is formed of PtMn.

6. The hybrid dual spin valve magnetoresistive read sensor of claim wherein said free layer further comprises two layers of CoFe with a layer of NiFe disposed therebetween.

7. A read/write head for accessing and storing data on a medium, comprising:
    an inductive write element;
    a hybrid dual spin valve magnetoresistive read sensor, including:
        a first antiferromagnetic layer formed of an antiferromagnetic material with a first Tb;
        a first soft ferromagnetic layer adjacent to said first antiferromagnetic layer;
        a first spacer layer formed of a conductive material and positioned adjacent to said first soft ferromagnetic layer;
        a free layer formed of a soft ferromagnetic material and positioned adjacent to said first spacer layer;
        a second spacer layer formed of a conductive material and positioned adjacent to said free layer;
        a second soft ferromagnetic layer formed of antiferromagnetic material with a second Tb, adjacent to said second spacer layer;
        a third spacer layer formed of a conductive material and positioned adjacent to said second soft ferromagnetic layer;
        a third soft ferromagnetic layer adjacent to said third spacer layer;
        a second antiferromagnetic layer; and
        a lead set formed of conductive material, electrically connected to said first spacer layer and configured to pass a first biasing current through said first spacer layer for pinning said first soft ferromagnetic layer.

8. The read/write head of claim 7, wherein said first antiferromagnetic layer is formed of a low blocking temperature antiferromagnetic material selected from the group including FeMn, IrMn, NiO, CoO and NiCoO, and said second antiferromagnetic layer is formed of a high blocking temperature antiferromagnetic material selected from the group including NiMn, CrMn, PtMn, PtPdMn, and CrPtMn.

9. The read/write head of claim 7, wherein said second antiferromagnetic layer is formed of a low blocking temperature antiferromagnetic material selected from the group including FeMn, IrMn, NiO, CoO and NiCoO, and said first antiferromagnetic layer is formed of a high blocking temperature antiferromagnetic material selected from the group including NiMn, CrMn, PtMn, PtPdMn, and CrPtMn.

10. A magnetic data storage and retrieval system, comprising:

a suspension system to which a read/write head is connected, said read/write head thereby being capable of being supported over a magnetic medium, said read/write head including an inductive write element and a hybrid dual spin valve magnetoresistive read sensor having:
  a hybrid dual spin valve including,
    a first antiferromagnetic layer formed of an antiferromagnetic material with a first Tb, having a magnetization orientation in a first direction,
    a first soft ferromagnetic layer positioned adjacent to said first antiferromagnetic layer and having a magnetization orientation pinned substantially parallel to said first direction by said first antiferromagnetic layer,
    a first spacer layer formed of a conductive material and positioned adjacent to said first soft ferromagnetic layer,
    a free layer formed of a soft ferromagnetic material and positioned adjacent to said first spacer layer,
    a second spacer layer formed of a conductive material and positioned adjacent to said free layer,
    a second soft ferromagnetic layer having a second magnetization orientation and positioned adjacent to said second spacer layer,
    a third spacer layer formed of a conductive material and positioned adjacent to said second soft ferromagnetic layer,
    a third soft ferromagnetic layer having a third magnetization orientation and positioned adjacent to said third spacer layer, and
    a second antiferromagnetic layer formed of antiferromagnetic material with a second Tb, having a fourth magnetization orientation in a direction that is substantially antiparallel to said first direction, said second antiferromagnetic layer pinning said third magnetization orientation of said third soft ferromagnetic layer in a direction substantially antiparallel said first direction, said third soft ferromagnetic layer and said second soft ferromagnetic layer being exchange-coupled such that said second magnetization orientation of said second soft ferromagnetic layer is maintained in a direction substantially parallel said first direction;
  a lead set formed of a conductive material and electrically connected to said hybrid dual spin valve;
  a current source electrically connected to said lead set; and
  a signal detection circuit electrically connected to said lead set and configured to detect changes in electrical resistance within said hybrid dual spin valve.

11. The magnetic data storage and retrieval system as recited in claim 10, further comprising a magnetic medium rotatably supported under said read/write head, and coupled to a motor for rotation about an axis.

12. The magnetic data storage and retrieval system as recited in claim 10, wherein said first antiferromagnetic layer is formed of a low blocking temperature antiferromagnetic material selected from the group including FeMn, IrMn, NiO, CoO and NiCoO, and said second antiferromagnetic layer is formed of a high blocking temperature antiferromagnetic material selected from the group including NiMn, CrMn, PtMn, PtPdMn, and CrPtMn.

13. The magnetic data storage and retrieval system as recited in claim 10, wherein said second antiferromagnetic layer is formed of a low blocking temperature antiferromagnetic material selected from the group including FeMn, IrMn, NiO, CoO and NiCoO, and said first antiferromagnetic layer is formed of a high blocking temperature antiferromagnetic material selected from the group including NiMn, CrMn, PtMn, PtPdMn, and CrPtMn.

14. A method for forming a hybrid dual spin valve magnetoresistive read sensor, comprising:

providing a hybrid dual spin valve including,
  a first antiferromagnetic layer having a first blocking temperature,
  a first soft ferromagnetic layer adjacent to said first antiferromagnetic layer,
  a first spacer layer formed of a conductive material and positioned adjacent to said first soft ferromagnetic layer,
  a free layer formed of a soft ferromagnetic material and positioned adjacent to said first spacer layer,
  a second spacer layer formed of a conductive material and positioned adjacent to said free layer,
  a second soft ferromagnetic layer adjacent to said second spacer layer,
  a third spacer layer formed of a conductive material and positioned adjacent to said second soft ferromagnetic layer,
  a third soft ferromagnetic layer adjacent to said third spacer layer, and
  a second antiferromagnetic layer having a second blocking temperature lower than said first blocking temperature;
fixing a magnetization orientation of said first antiferromagnetic layer;
fixing a magnetization orientation of said second antiferromagnetic layer;
attaching a lead set formed of a conductive material to said hybrid dual spin valve;
attaching a current source to said lead set; and
attaching a signal detection circuit to said lead set, said signal detection circuit configured to detect changes in electrical resistance within said hybrid dual spin valve.

15. The method of claim 14, wherein fixing a magnetization orientation of said first antiferromagnetic layer further includes:

heating said hybrid dual spin valve to a first temperature;
placing said hybrid dual spin valve within a first external magnetic field having a first orientation for a time sufficient to allow said first antiferromagnetic layer to acquire a magnetization orientation substantially parallel to said first orientation of said first external magnetic field; and
cooling said hybrid dual spin valve within said first external magnetic field to substantially fix said magnetization orientation.

16. The method of claim 15, wherein said first temperature is above said first blocking temperature.

17. The method of claim 15, wherein said first temperature is near said first blocking temperature.

18. The method of claim 14, wherein fixing a magnetization orientation of said second antiferromagnetic layer further includes:

heating said hybrid dual spin valve to a second temperature;

placing said hybrid dual spin valve within a second external magnetic field having a second orientation for a time sufficient to allow said second antiferromagnetic layer to acquire a magnetization orientation substantially parallel to said second orientation of said second external magnetic field; and cooling said hybrid dual spin valve within said second external magnetic field to substantially fix said magnetization orientation.

19. The method of claim 18, wherein said second temperature is above said second blocking temperature.

20. The method of claim 18, wherein said second temperature is near said second blocking temperature.

21. A method for forming a hybrid dual spin valve magnetoresistive read sensor, comprising:

providing a hybrid dual spin valve including,
- a first antiferromagnetic layer having a first blocking temperature,
- a first soft ferromagnetic layer adjacent to said first antiferromagnetic layer,
- a first spacer layer formed of a conductive material and positioned adjacent to said first soft ferromagnetic layer,
- a free layer formed of a soft ferromagnetic material and positioned adjacent to said first spacer layer,
- a second spacer layer formed of a conductive material and positioned adjacent to said free layer,
- a second soft ferromagnetic layer adjacent to said second spacer layer,
- a third spacer layer formed of a conductive material and positioned adjacent to said second soft ferromagnetic layer,
- a third soft ferromagnetic layer adjacent to said third spacer layer, and
- a second antiferromagnetic layer having a second blocking temperature higher than said first blocking temperature;

fixing a magnetization orientation of said second antiferromagnetic layer;

fixing a magnetization orientation of said first antiferromagnetic layer;

attaching a lead set formed of a conductive material to said hybrid dual spin valve;

attaching a current source to said lead set; and attaching a signal detection circuit to said lead set, said signal detection circuit configured to detect changes in electrical resistance within said hybrid dual spin valve.

22. The method of claim 21, wherein fixing a magnetization orientation of said second antiferromagnetic layer further includes:

heating said hybrid dual spin valve to a first temperature;

placing said hybrid dual spin valve within a first external magnetic field having a first orientation for a time sufficient to allow said second antiferromagnetic layer to acquire a magnetization orientation substantially parallel to said first orientation of said first external magnetic field; and cooling said hybrid dual spin valve within said first external magnetic field to substantially fix said magnetization orientation.

23. The method of claim 22, wherein said first temperature is above said second blocking temperature.

24. The method of claim 22, wherein said first temperature is near said second blocking temperature.

25. The method of claim 21, wherein fixing a magnetization orientation of said first antiferromagnetic layer further includes:

heating said hybrid dual spin valve to a second temperature;

placing said hybrid dual spin valve within a second external magnetic field having a second orientation for a time sufficient to allow said first antiferromagnetic layer to acquire a magnetization orientation substantially parallel to said second orientation of said second external magnetic field; and cooling said hybrid dual spin valve within said second external magnetic field to substantially fix said magnetization orientation.

26. The method of claim 25, wherein said second temperature is above said first blocking temperature.

27. The method of claim 25, wherein said second temperature is near said first blocking temperature.

* * * * *

UNITED STATES PATENT AND TRADEMARK OFFICE
CERTIFICATE OF CORRECTION

PATENT NO.     : 6,381,105 B1
DATED          : April 30, 2002
INVENTOR(S)    : Yiming Huai et al.

It is certified that error appears in the above-identified patent and that said Letters Patent is hereby corrected as shown below:

Column 12,
Line 48, replace "1000 Oe" with -- 10000 Oe --.

Signed and Sealed this

Eighteenth Day of March, 2003

JAMES E. ROGAN
*Director of the United States Patent and Trademark Office*